(12) United States Patent
Binder

(10) Patent No.: US 7,696,777 B2
(45) Date of Patent: *Apr. 13, 2010

(54) SYSTEM FOR TRANSMISSION LINE TERMINATION BY SIGNAL CANCELLATION

(75) Inventor: Yehuda Binder, Hod Hasharon (IL)

(73) Assignee: MOSAID Technologies Incorporated, Ottawa, Ontario (CA)

( * ) Notice: Subject to any disclaimer, the term of this patent is extended or adjusted under 35 U.S.C. 154(b) by 0 days.

This patent is subject to a terminal disclaimer.

(21) Appl. No.: 12/252,025

(22) Filed: Oct. 15, 2008

(65) Prior Publication Data

US 2009/0039914 A1 Feb. 12, 2009

Related U.S. Application Data

(60) Continuation of application No. 12/026,321, filed on Feb. 5, 2008, now Pat. No. 7,453,284, which is a continuation of application No. 11/346,396, filed on Feb. 3, 2006, now Pat. No. 7,336,096, which is a division of application No. 11/100,453, filed on Apr. 7, 2005, now Pat. No. 7,068,066, which is a continuation of application No. 10/380,538, filed as application No. PCT/IL01/00863 on Sep. 12, 2001, now Pat. No. 6,937,056.

(30) Foreign Application Priority Data

Sep. 17, 2000 (IL) ....................... 138517

(51) Int. Cl.
*H03K 17/16* (2006.01)
*H03K 19/003* (2006.01)

(52) U.S. Cl. .............................. 326/30; 326/32; 326/86; 326/90

(58) Field of Classification Search ................... 326/30, 326/86, 90
See application file for complete search history.

(56) References Cited

U.S. PATENT DOCUMENTS

| 5,530,377 | A | 6/1996 | Walls |
|---|---|---|---|
| 5,608,312 | A | 3/1997 | Wallace |
| 5,706,447 | A | 1/1998 | Vivio |
| 5,793,223 | A | 8/1998 | Fankeny |
| 5,841,360 | A | 11/1998 | Binder |
| 6,396,391 | B1 | 5/2002 | Binder |
| 6,425,025 | B1 | 7/2002 | Kamepalli |
| 6,480,510 | B1 | 11/2002 | Binder |

(Continued)

OTHER PUBLICATIONS

Strassberg, Dan; "Home Automation Buses: Protocols Really Hit Home"; EDN Design Feature, Apr. 13, 1995 (9 pages).

(Continued)

*Primary Examiner*—Anh Q Tran
(74) *Attorney, Agent, or Firm*—Browdy and Neimark, PLLC

(57) ABSTRACT

A communication system having first and second states for use with a shared transmission line composed of at least two conductors and composed of first and second transmission line segments connected to each other at a single connection point. In the first state, a termination is coupled to the single connection point and is operative to at least attenuate a signal propagated between the first and second segments. In the second state, a driver is coupled to the connection point and is operative to conduct a signal over the first and second segments.

11 Claims, 13 Drawing Sheets

U.S. PATENT DOCUMENTS

| | | | |
|---|---|---|---|
| 6,549,616 B1 | 4/2003 | Binder | |
| 6,690,677 B1 | 2/2004 | Binder | |
| 6,842,459 B1 | 1/2005 | Binder | |
| 6,956,826 B1 | 10/2005 | Binder | |
| 6,961,303 B1 | 11/2005 | Binder | |
| 7,106,721 B1 | 9/2006 | Binder | |
| 7,453,284 B2 * | 11/2008 | Binder | 326/30 |

OTHER PUBLICATIONS

Hachman, Mark; "Compaq to Ride the CEBus"; EBN Jan. 22, 1996 (1 page).

Hoffman, J.; "Cable, Television, and the Consumer Electronic Bus"; Panasonic Technologies. Inc., pp. 165-173.

IS-60.04; Node Communications Protocol Part 6: Application Layer Specification; Revision Apr. 18, 1996 (129 pages).

Markwalter, Brain et al; "CEBus Router Testing"; IEEE Transactions on Consumer Electronics Nov. 1991, vol. 37 No. 4 (8 pages).

Grayson Evans, the CEBUs Standard User's Guide, 1st edition, May 1996, 317 pages.

"Active Termination of a high-speed, multi-drop, Bidirectional Digital Transmission System", IBM Technical Cisclosure Bulletin, IBM Corp. New York, US, Aug. 1, 1990, pp. 301-303.

"Active Termination for Transmission Line" Database IBM TDB 'Online! IBM'; IBM Technical Disclosure Bulletin, Mar. 1986, XP002210580, whole document.

* cited by examiner

Fig. 1 (PRIOR-ART)

Fig. 2 (PRIOR-ART)

SYSTEM FOR TRANSMISSION LINE TERMINATION BY SIGNAL CANCELLATION

CROSS-REFERENCE TO RELATED APPLICATIONS

This is a continuation of U.S. application Ser. No. 12/026,321, filed Feb. 5, 2008, now allowed, which is a continuation of U.S. application Ser. No. 11/346,396, filed on Feb. 3, 2006, now allowed, which is a division of U.S. application Ser. No. 11/100,453, filed on Apr. 7, 2005, which is a continuation of U.S. application Ser. No. 10/380,538, filed on Sep. 12, 2001, now U.S. Pat. No. 6,937,056, issued on Aug. 30, 2005, which is a national stage of PCT/IL01/00863, filed on Sep. 17, 2000, the disclosure of which is incorporated herein by reference.

FIELD OF THE INVENTION

The present invention relates to the field of electrically-wired communication, and, in particular, to communication lines employing termination.

BACKGROUND OF THE INVENTION

The term "data unit" herein denotes any data processing device, such as a computer or a personal computer, including workstations or other data terminal equipment (DTE) with an interface for connection to any wired communication network, such as a Local Area Network (LAN).

Transmission lines over which digital signals are transmitted must be properly terminated in order to prevent overshoot, undershoot and reflections. These effects, when caused by impedance mismatch, become more pronounced as the length of the conductor increases, and limit the rate at which data can be transmitted over a transmission line. The transmission line can be a trace on an integrated circuit, a trace on a board, or a wire in a cable. The impedance of both the source and load should be matched to the characteristic impedance of the transmission line. Since the output impedance of a transmitter and the input impedance of a receiver generally differ from the characteristic impedance of a transmission line interconnecting the transmitter and the receiver in a point-to-point configuration, it is necessary to alter the existing impedance differently at the source and load ends of the transmission line.

Wire-based communication networks commonly employ terminations in order to avoid reflections. An example of termination within a network is shown in FIG. 1. A shared wired network 10 is based on a two-wire transmission line having wires 15$a$ and 15$b$. In the following description, reference will be made to "transmission line 15$a$ and 15$b$", it being understood that the reference numerals actually refer to the wires forming the transmission line. For example, network 10 may be an EIA/TIA-485 standard type, wherein transmission line 15$a$ and 15$b$ consists of a single twisted pair, or an Ethernet IEEE802.3 standard 10Base2 or 10Base5, wherein transmission line 15$a$ and 15$b$ is a coaxial cable. In general, the term 'transmission line' herein denotes any electrically-conductive media capable of carrying electrical current and voltages, and transporting electromagnetic signals, including without limitation wires, cables, and PCB traces. Differential line drivers 11$a$ and 11$b$ are used in order to transmit signals to the transmission line, while line-receivers 12$a$ and 12$b$ are used to receive signals carried over transmission line 15$a$ and 15$b$. Data unit 16$a$ is a "transmit only" unit, which transmits data to the transmission line via line driver 11$a$, and data unit 16$b$ is a "receive only" unit that receives data from the transmission line via line receiver 12$a$. Data unit 16$c$ can both receive data from and transmit data to the transmission line 15$a$ and 15$b$ via line diver 11$b$ and line receiver 12$b$, forming a transceiver 14. Of course, additional units can be connected to shared transmission lines, each such units employing a line receiver, a line driver, or both. In order to allow for proper operation of network 10, terminators 13$a$ and 13$b$ are commonly installed and connected to both ends of transmission line 15$a$ and 15$b$. In order to function properly, terminators 13$a$ and 13$b$ should be equal in impedance to the characteristic impedance of transmission line 15$a$ and 15$b$. Similarly, such terminations are employed in both ends of a point-to-point connection.

The need for termination is a major drawback in building a network. First, the transmission line ends must be identified and accessed, which may not be simple in the case of existing wiring. Additionally, terminator installation requires both labor and materials, and there is also the issue of additional equipment required to configure a network. Furthermore, for proper operation, the termination type, topology and values are mainly based on the transmission line characteristics, which may be unknown and/or inconsistent, and may vary from cable to cable or from location to location.

An additional drawback of network 10 relates to being a multi-point shared transmission line network. In a Time Domain Multiplexing (TDM) scheme, only a single driver can transmit over the transmission line during any time interval, rendering other units as receive-only during that time interval. This limits the total volume of data that can be transported over a specified period. In order to allow multiple data transport over this shared transmission line, it is necessary to allow multiple transmitters and receiver to use the transmission line simultaneously.

One common method for such multiple transmissions over shared transmission line employs the Frequency Domain Multiplexing (FDM) scheme, wherein each transmitter uses a different dedicated portion of the transmission line's available spectrum. Such a solution, however, requires complex and expensive circuitry.

Another method for enabling multiple transmissions is shown in FIG. 2, and involves splitting the transmission line into distinct segments. A network 20 is shown in part, wherein the transmission line is split into two distinct portions, one of which is identified as transmission line segment 15$a$ and 15$b$ (as in FIG. 1), while the other portion is identified as a transmission line segment 15$c$ and 15$d$. Transmission line segment 15$a$ and 15$b$ is used for full duplex communication using line drivers 11$a$2 and 11$b$1, located at respective ends of transmission line segment 15$a$ and 15$b$. Similarly, line receivers 12$b$ and 12$a$2 as well as terminators (not shown) are installed at the respective ends of transmission line segment 15$a$ and 15$b$. Line driver 11$a$2 and line receiver 12$a$2 are both part of a unit 21$a$, which is connected at one end of transmission line segment 15$a$ and 15$b$. Similarly, transmission line segment 15$c$ and 15$d$ is coupled to line drivers 11$c$1 and 11$b$2, as well as to line receivers 12$c$1 and 12$b$2. Line driver 11$c$1 and line receiver 12$c$1 are both part of a unit 21$c$, connected at one end of transmission line segment 15$c$ and 15$d$. Line drivers 11$b$2 and 11$b$1, as well as line receivers 12$b$1 and 12$b$2 are all part of a unit 21$b$, connected to transmission line segment 15$a$ and 15$b$, and to transmission line segment 15$c$ and 15$d$. These two distinct transmission line segments as well as their related drivers/receivers are coupled by a logic block 22, which is part of unit 21$b$. In certain prior art configurations, the logic block is either omitted or acts as transparent connection. In such case, unit 21b serves as a repeater. In other configurations, logic block 22 processes the data streams flowing through unit 21b.

Network 20 offers two major advantages over network 10 as shown in FIG. 1. First, each transmission line segment of network 20 is independent, allowing two communication links to operate simultaneously. Hence, line driver 11a2 of unit 21a can transmit data over transmission line segment 15a and 15b, to be received by line receiver 12b1 of unit 21b. Simultaneously, and without any interference, line driver 11c1 of unit 21c can transmit data over transmission line segment 15c and 15d to be received by line receiver 12b2 of unit 21b.

Yet another advantage of network 20 is that of having point-to-point communication segments. As is well known in the art, point-to-point topology is a highly favored configuration in wired communication, enabling robust, high bandwidth communications with low-cost, simple circuitry.

Principles of the above description are demonstrated by the evolution of the Ethernet Local Area Network (LAN) as specified in the IEEE802.3 standard, wherein shared transmission line systems based on coaxial cable 10Base2 and 10Base5 were upgraded towards 10BaseT and 10BaseTX based networks, both built around point-to-point segments.

However, network 20 also exhibits a major disadvantage in comparison to network 10. As shown in FIG. 1, network 10 uses a continuous uninterrupted transmission line. In contrast, the wiring of network 20 must be cut at several points throughout the network, wherein units 21 are simply connected. In the case of existing transmission lines (such as in-wall telephone wiring), cutting into the network may be complex, expensive, and labor-intensive.

There is thus a widely recognized need for, and it would be highly advantageous to have, a means for implementing a generic termination that is not transmission line-dependent, and which therefore would not need to be changed when the transmission line characteristics change. There is also a widely recognized need for a means for simultaneous multiple use of a single wiring infrastructure, and for employing a point-to-point connection scheme, without modifying such existing wiring. These goals are addressed by the present invention.

SUMMARY OF THE INVENTION

The invention relates to a system and method for signal termination, based on a two-port unit, denoted herein as a Signal Canceling Unit (SCU). The SCU senses the signal present over its terminal, and operates to absorb and cancel this signal. When connected at an end of a transmission line, such as a wire transmission line used for communication, the SCU functions as a terminator by absorbing the signal energy. When connected in the middle of such wiring transmission line, the SCU terminates any signal sensed over its terminals, and thus can be used for noise isolation, or to emulate a network end in the connected points. In this functional mode, the SCU effectively splits the wires, allowing for different independent networks operation at each side of the SCU connection, without interfering or interacting with each other, even though the continuity of the wiring is not affected.

In another embodiment, the SCU is upgraded to include line receiver functionality, denoted herein as a Signal Canceling and Receiving Unit (SCRU). In addition to having full SCU functionality, the SCRU also operates as a line receiver, and hence can be used as an active receiver in the network, in addition to serving in termination and signal canceling roles.

In yet another embodiment, the SCRU is upgraded to include line driver functionality, denoted herein as a Signal Canceling, Receiving, and Transmitting Unit (SCRTU). In addition to having full SCRU functionality, the SCRTU also performs as a line driver, and hence can be used as an active transmitter in the network, in addition to serving in termination, signal canceling, and receiving roles. Multiple SCRTU's connected to wired transmission lines can communicate for construction of a full network. In such a network, every pair of adjacent-connected SCRTUs can communicate in a point-to-point fashion, in a terminated and independent transmission line segment.

Therefore, according to a broad aspect of the present invention there is provided a device for actively terminating and isolating a continuously conducting transmission line, said device comprising:

a sensor operative to sensing a first signal on the transmission line;

a first driver operative to placing a second signal on the transmission line for canceling the first signal; and a processing unit operative to receiving input from said sensor and providing input to said first driver.

BRIEF DESCRIPTION OF THE DRAWINGS

In order to understand the invention and to see how it may be carried out in practice, a preferred embodiment will now be described, by way of non-limiting example only, with reference to the accompanying drawings, in which.

DETAILED DESCRIPTION OF THE INVENTION

Figure 1:
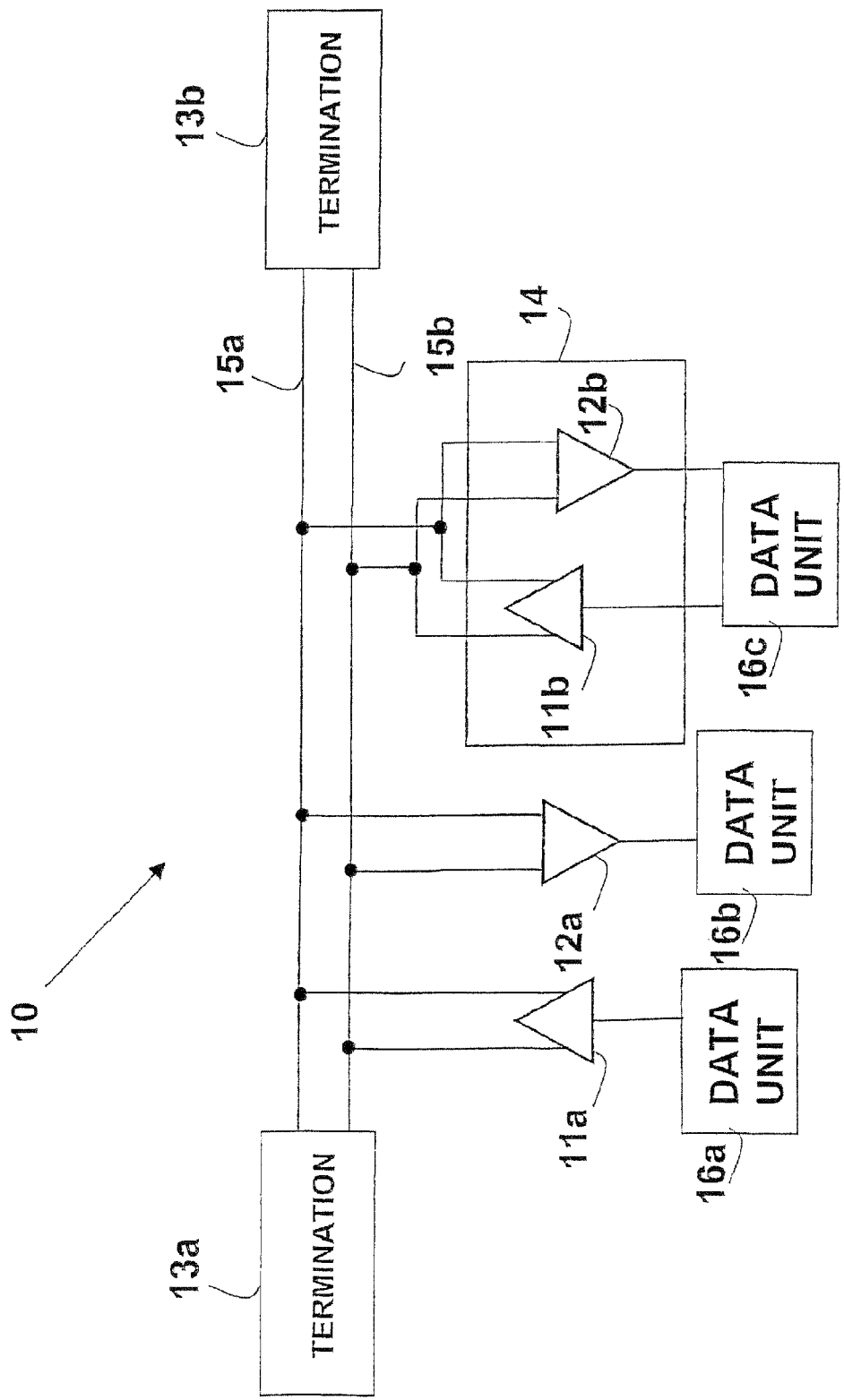
FIG. 1 shows a common prior art shared wired Local Area Network configuration.
Figure 2:
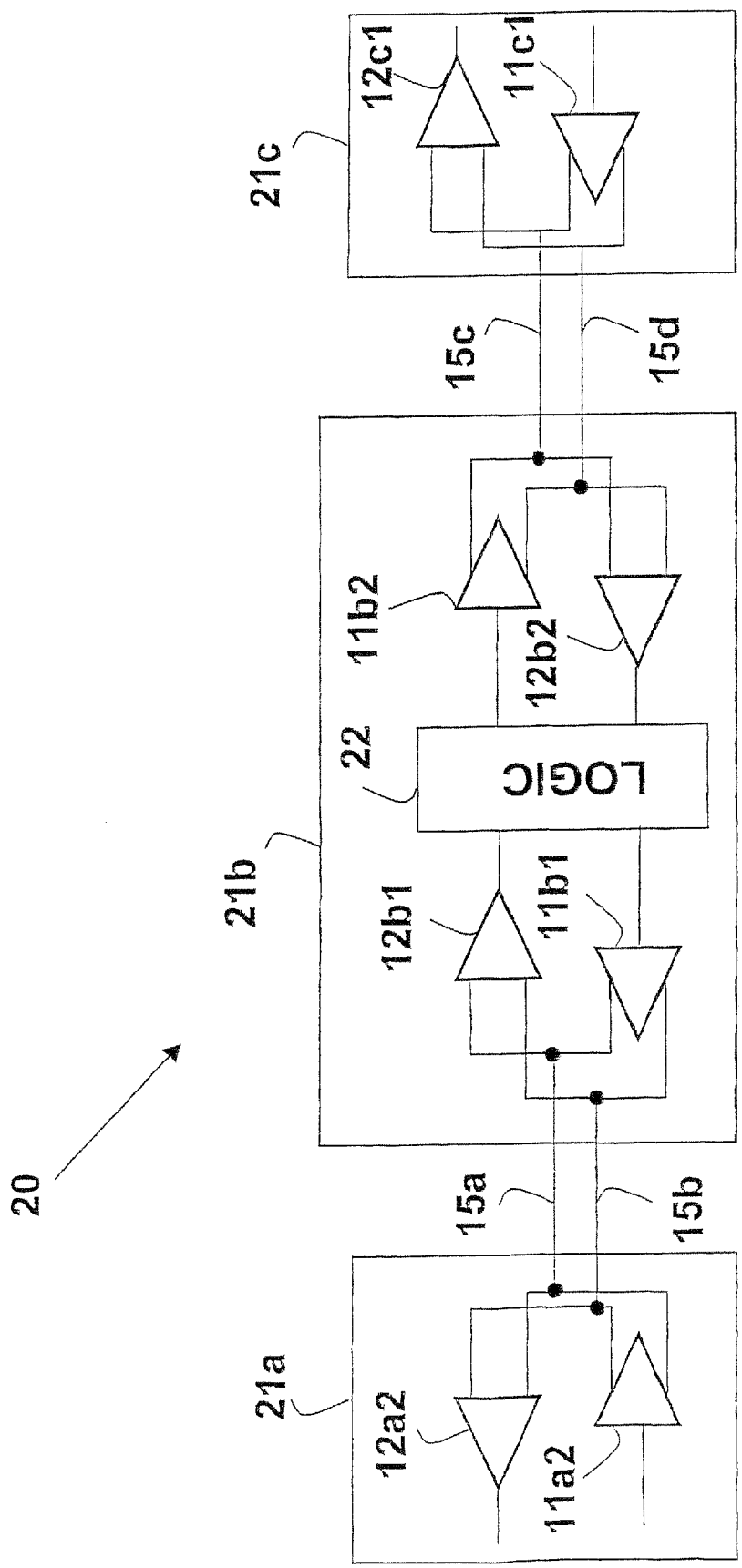
FIG. 2 shows a prior art repeater based communication network.

The principles and operation of a network according to the present invention may be understood with reference to the drawings and the accompanying description. The drawings and descriptions are conceptual only. In actual practice, a single component can implement one or more functions; alternatively, each function can be implemented by a plurality of components and circuits. In the drawings and descriptions, identical reference numerals indicate those components that are common to different embodiments or configurations.

Figure 3:
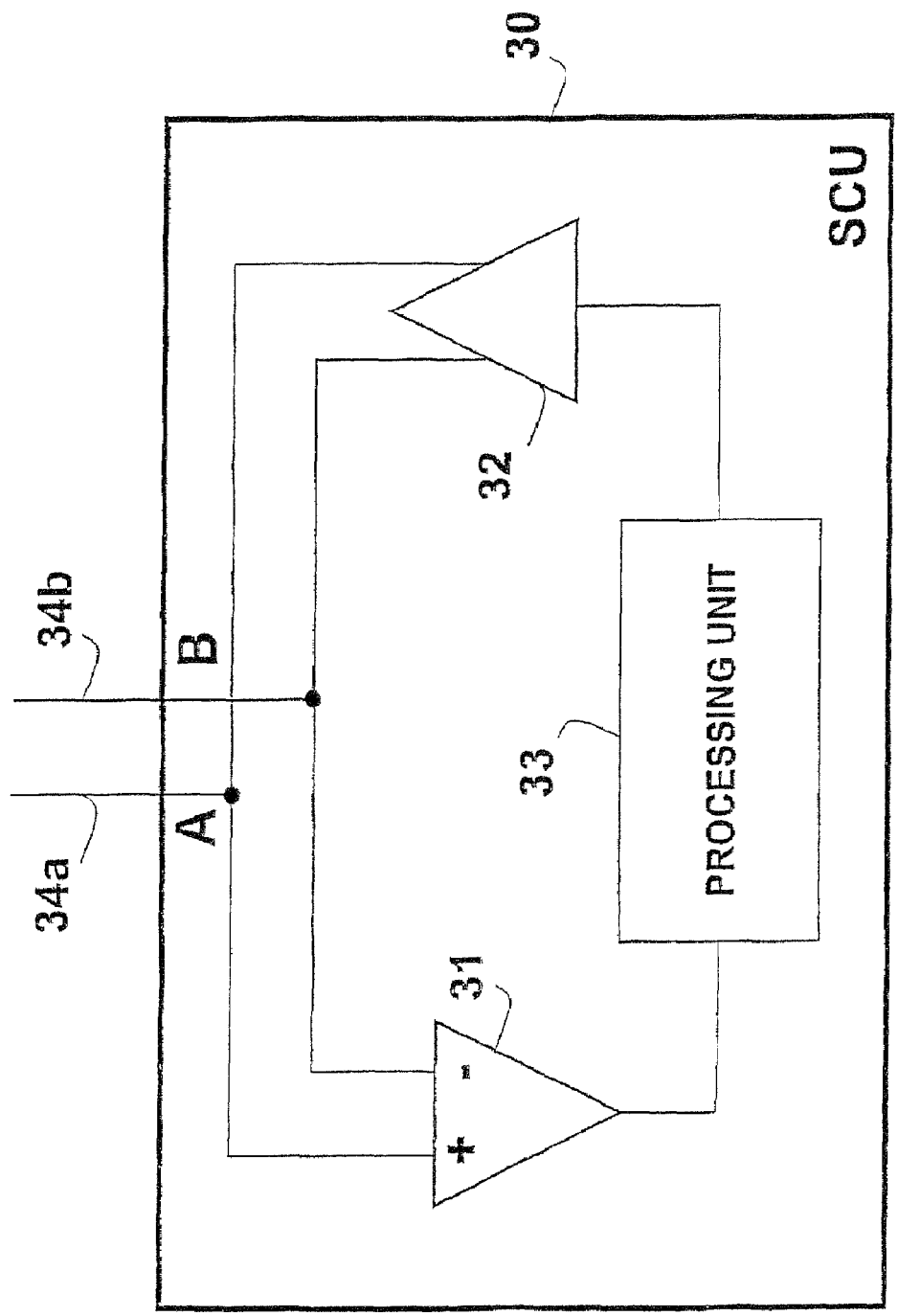
FIG. 3 shows a Signal Canceling Unit (SCU) functional block diagram according to a first embodiment of the present invention.

FIG. 3 illustrates a Signal Canceling Unit (SCU) 30, which includes two external terminal connections, a terminal 34a (A) and a terminal 34b (B). Coupled to these terminals is a sensor 31, which measures the differential voltage (constituting a "first signal") between terminal 34a and terminal 34b. The value measured by sensor 31 is input into a processing unit 33, which in turn provides input to a differential driver 32 (constituting a "first driver"), whose outputs are coupled to the terminal 34a and terminal 34b. Driver 32 can sink or source enough current (constituting a "second signal") to cancel the first signal at the terminals. Processing unit 33 along with sensor 31 and driver 32 forms a closed negative feedback loop, which attenuates and cancels any signal sensed over terminal 34a and terminal 34b.

Figure 4:
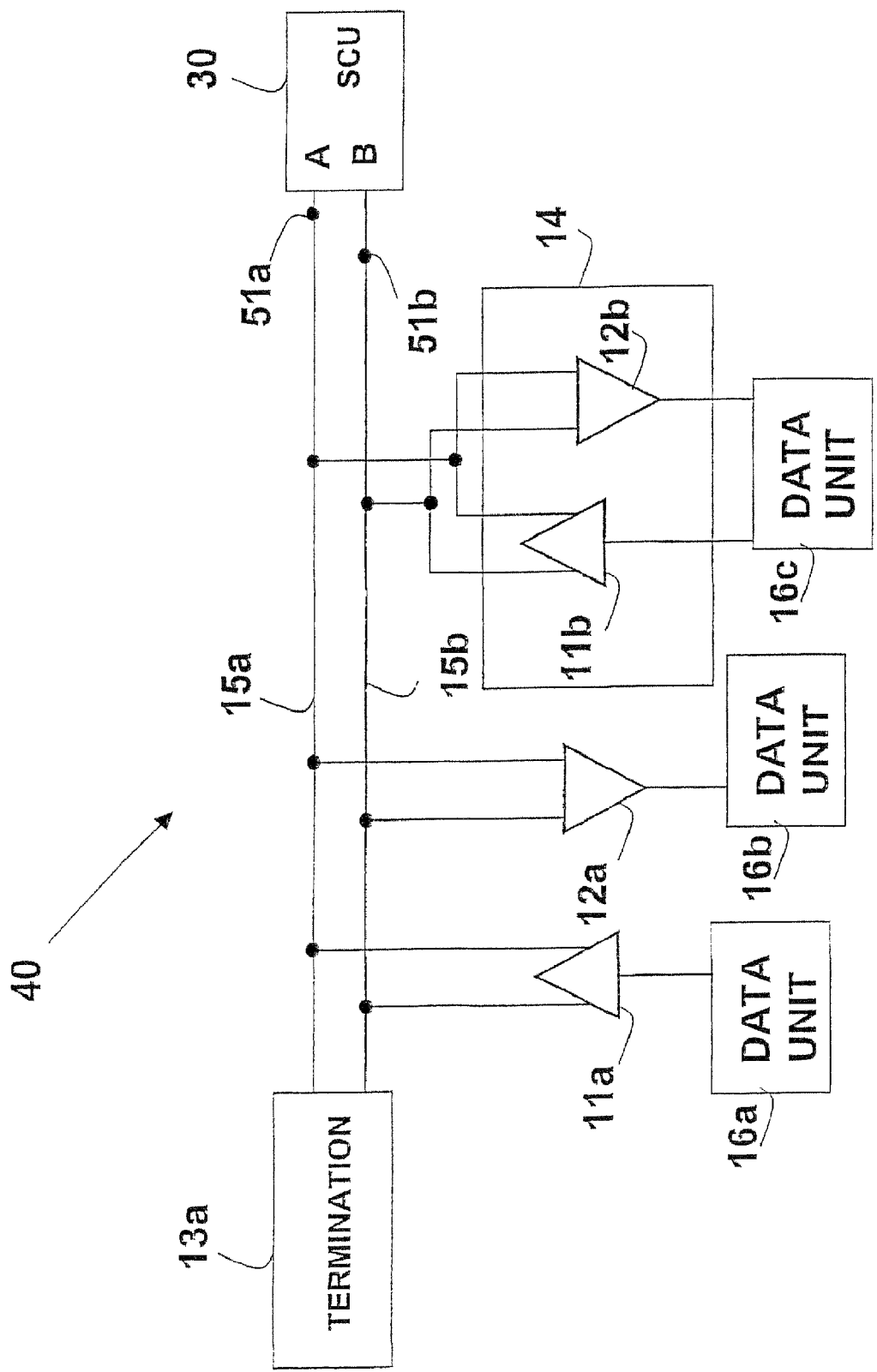
FIG. 4 shows a shared wiring based network, wherein an SCU is used as an end terminator according to the present invention.

FIG. 4 illustrates a network 40, with SCU 30 used as a terminator. Network 40 is based on network 10 (FIG. 1), but modified to use SCU 30 as a terminator in place of terminator 13b. Signals transmitted to transmission line 15a and 15b (by line driver 11a, for example) propagate along the transmission line. Upon reaching the end of the transmission line, where terminals 51a and 51b of SCU 30 are connected, SCU 30 senses and acts to cancel the signals. As a result, the signal energy is absorbed by SCU 30, and neither reflection nor any other mismatch occurs. Hence, SCU 30 acts as a termination device. However, since the structure of SCU 30 is generic and is not tailored to the specific transmission line (e.g., characteristic impedance), this same SCU can be used for many types of transmission line, such as twisted pair wiring, coaxial cables, etc., obviating the need to match a specific termination to a specific transmission line. This, of course, provides simple installation and easy logistics, due to the employment of common components for various different applications.

Figure 5:
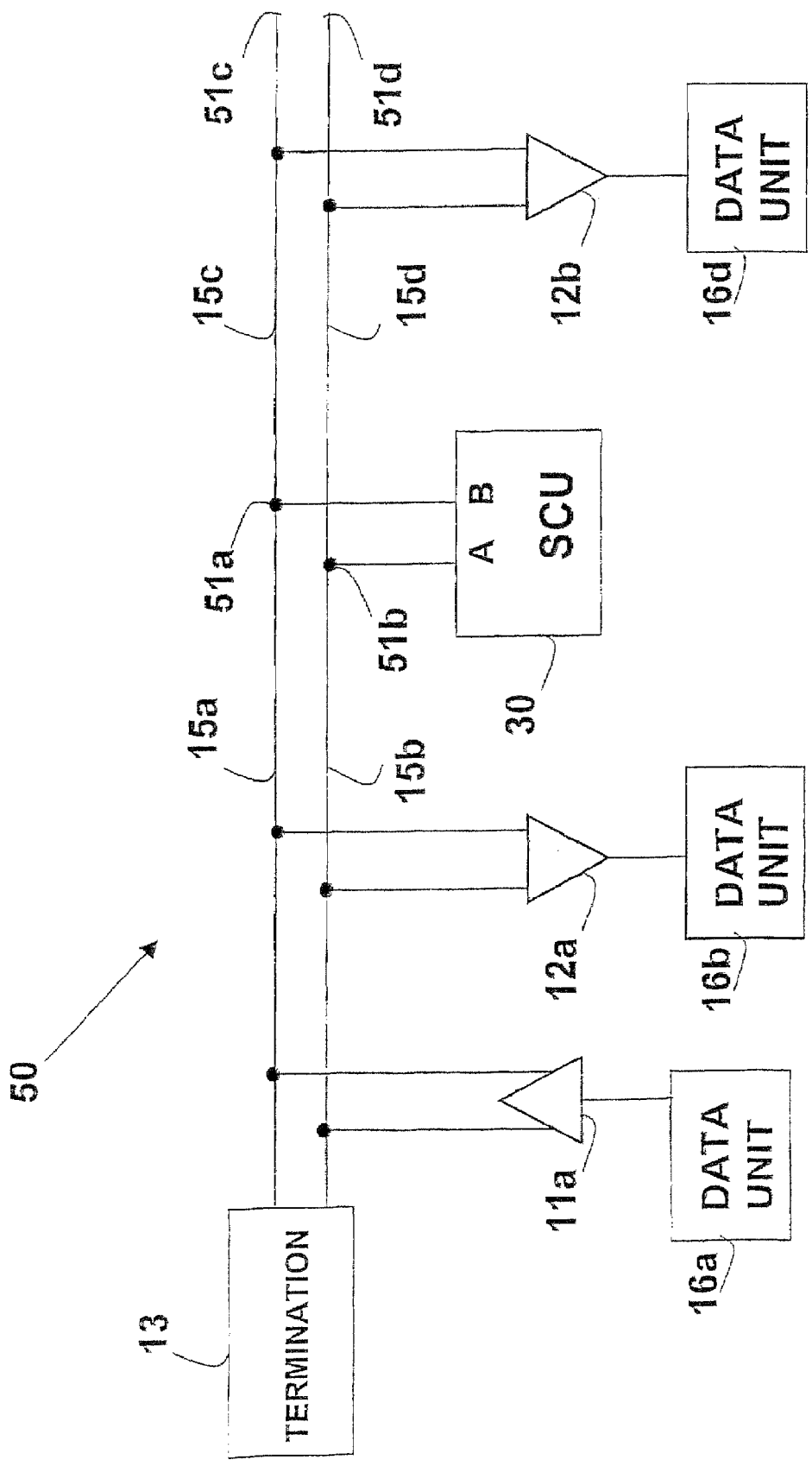
FIG. 5 shows a shared wiring based network, wherein an SCU is used as a parallel connected terminator according to the present invention.

A further advantage of using an SCU as a terminator stems from the fact that the SCU performs the termination function even when not connected at the ends of the transmission line, but at any point throughout the transmission line run, as illustrated in FIG. 5 for a network 50, which is based on transmission line 15a, 15b, 15c, and 15d. As with network 10 (FIG. 1), terminator 13 is located at one end (left side of the figure), and line driver 11a and line receivers 12a and 12b are coupled to the transmission line. Data units 16a, 16b, and 16d are coupled to line units 11a, 12a, and 12b, respectively. If SCU 30 were not present in network 50, network 10 of FIG. 1 would be obtained, wherein data unit 16a can transmit data to the entire transmission line via line driver 11a. The transmitting signals would then propagate in the transmission line and would be received by data units 16b and 16d via line receivers 12a and 12b, respectively. In this case, however, where SCU 30 is connected to the transmission line at connection points 51a and 51b, the network 50 is modified such that signals transmitted to line driver 11a, are propagated in the transmission line in two directions. Part of the signal energy is propagated towards terminator 13 (towards the left side of the figure), where they are absorbed. The other part of the signal energy propagates towards points 51c and 51d, representing the other end of the wiring. When the signal reaches points 51a and 51b (connected to the terminals of SCU 30), SCU 30 operates to attenuate, cancel, and absorb the signal energy. Thus, little or no signal will propagate from the points 51a and 51b towards the end points 51c and 51d. In such case, while line receiver 12a will receive the transmitted signals, line receiver 12b will not sense any such signals, which are attenuated by SCU 30. Thus, SCU 30 functions as a terminator for the network segment 15a and 15b, extending from terminator 13 to points 51a and 51b, helping to avoid reflections in this part of the transmission line. As a result, SCU 30 modifies the functionality of the continuous transmission line to be virtually separated into two distinct segments, one using the transmission line from terminator 13 to points 51a and 51b, while the other uses the transmission line from points 51a and 51b to the end-points 51c and 51d. The two network segments are isolated in the sense that signals in one segment cannot pass to the other, even though electrical continuity of the transmission line is fully retained.

Figure 6:
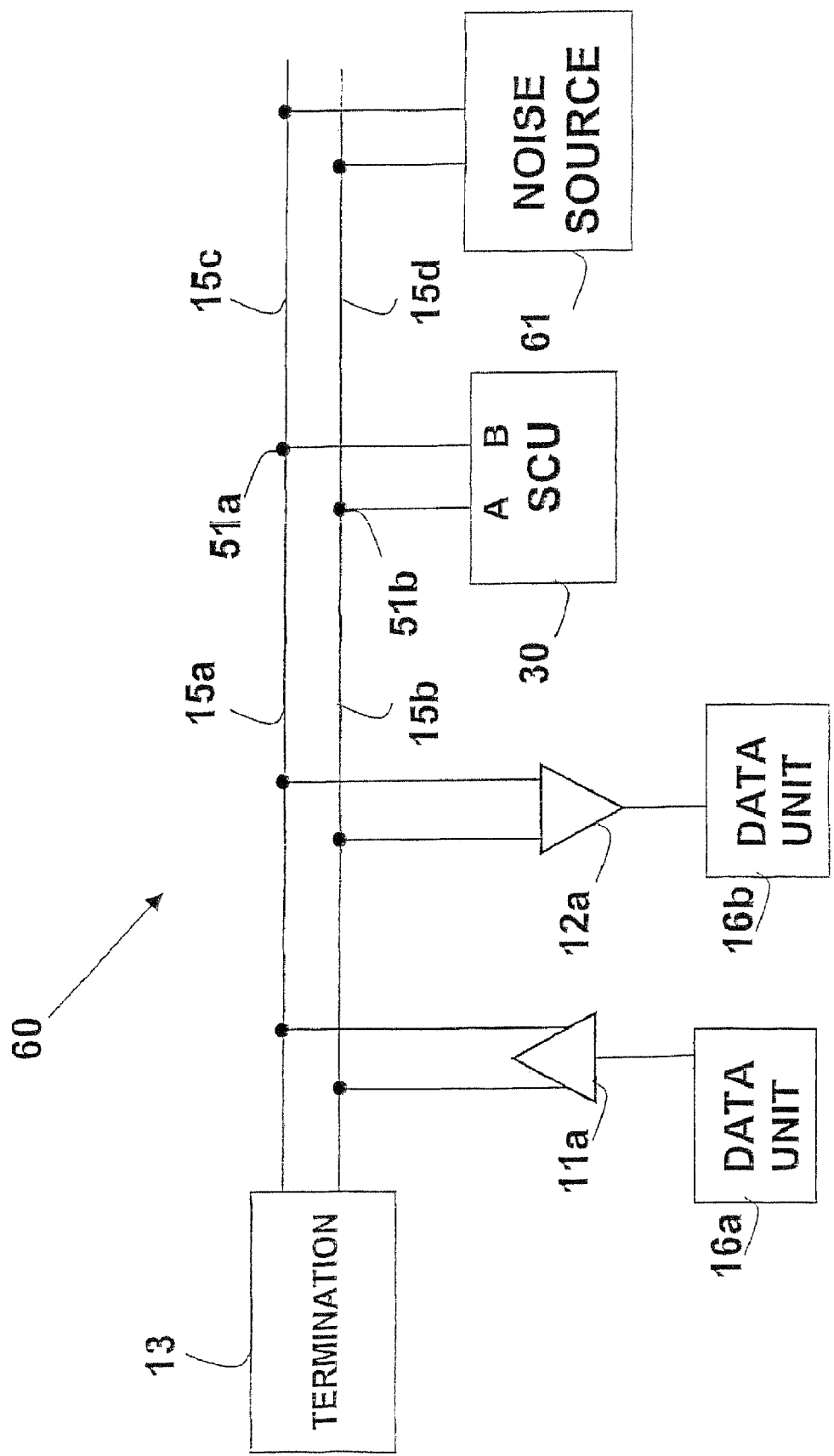
FIG. 6 shows a shared wiring based network, wherein an SCU is used for noise isolating according to the present invention.

One application of such virtual networks separation is for noise isolation, as illustrated in FIG. 6 with a network 60. Network 60 is similar to network 50 (FIG. 5), except that a noise source 61 appears in place of data unit 16d and line receiver 12b. The noise generated by noise source 61 propagates (in the left direction) towards SCU 30. Upon reaching SCU terminals 51a and 51b, SCU 30 operates to attenuate the noise signal, and prevents the noise from reaching transmission line 15a and 15b and thereby degrading communication over that network segment. While noise source 61 is described and illustrated as a distinct unit connected at a single point to transmission line 15c and 15d, the same noise cancellation function is performed where noise is generated by inductive means from external sources. For example, transmission line 15c and 15d may extend over an area near sources of electromagnetic interference. The SCU can thus help in isolating the induced noise from a specific portion of the conductive transmission line.

Figure 7:
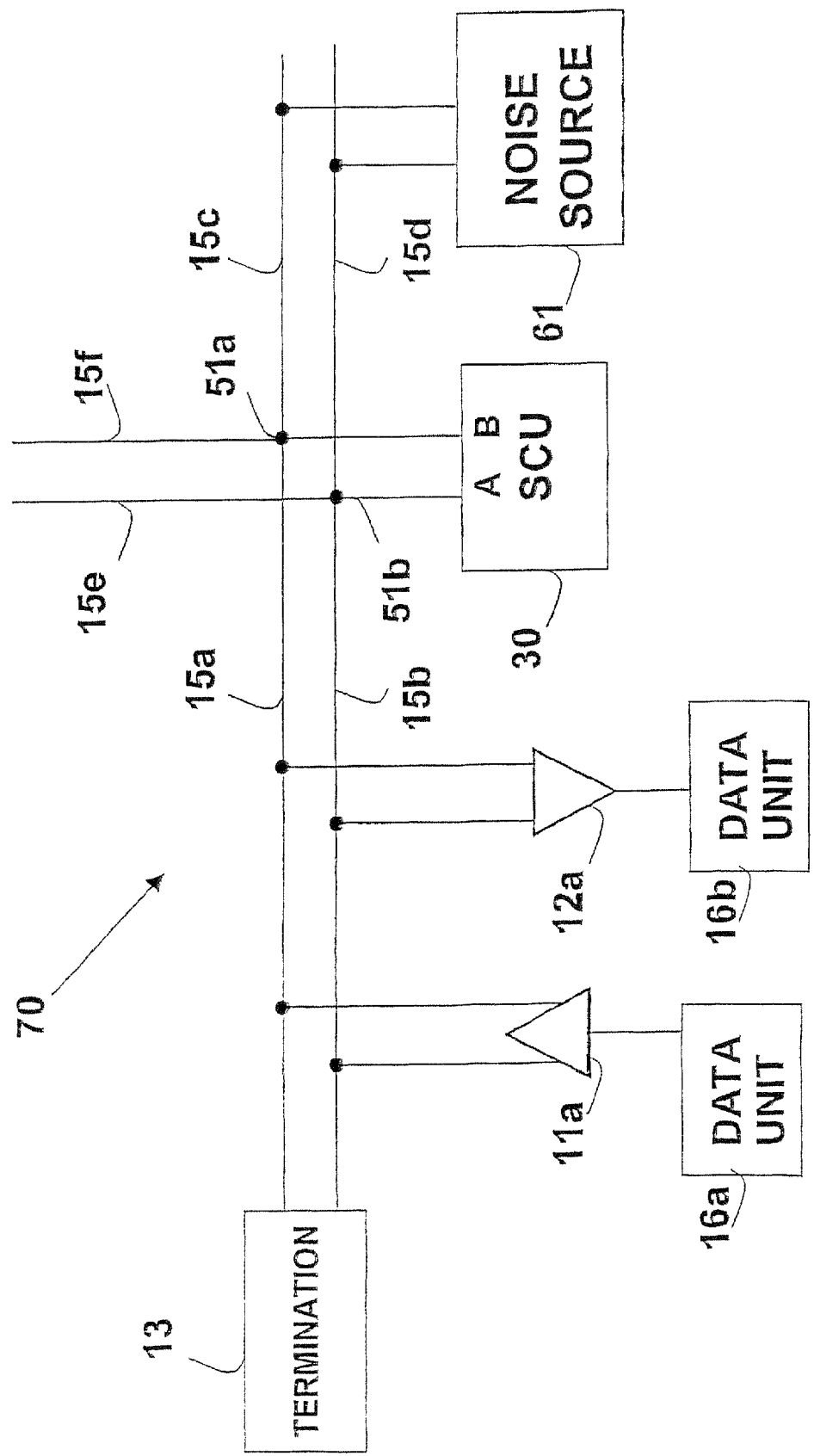
FIG. 7 shows a shared wiring based network, wherein an SCU is used for bridge-tap isolating according to the present invention.

Bridge-taps are known to cause impedance mismatch and reflections in transmission lines and other wired communication environments. FIG. 7 illustrates a network 70, which is similar to network 60 (FIG. 6), but with added transmission line 15e and 15f, connected to terminals 51a and 51b respectively, forming a bridge tap at terminals 51a and 51b. Without SCU 30, the bridge tap at these points would create an impedance mismatch and cause signal reflections in the communications over transmission line 15a, 15b, 15c, 15d, 15e, and 15f. The presence of SCU 30 at the bridge-tap junction, however, cancels and absorbs the signals at terminals 51a and 51b, and eliminates such reflections. In doing so, three isolated communication segments are formed, one segment consisting of transmission line 15a and 15b, a second segment consisting of transmission line 15c and 15d, and a third segment consisting of transmission line 15e and 15f.

Figure 8:
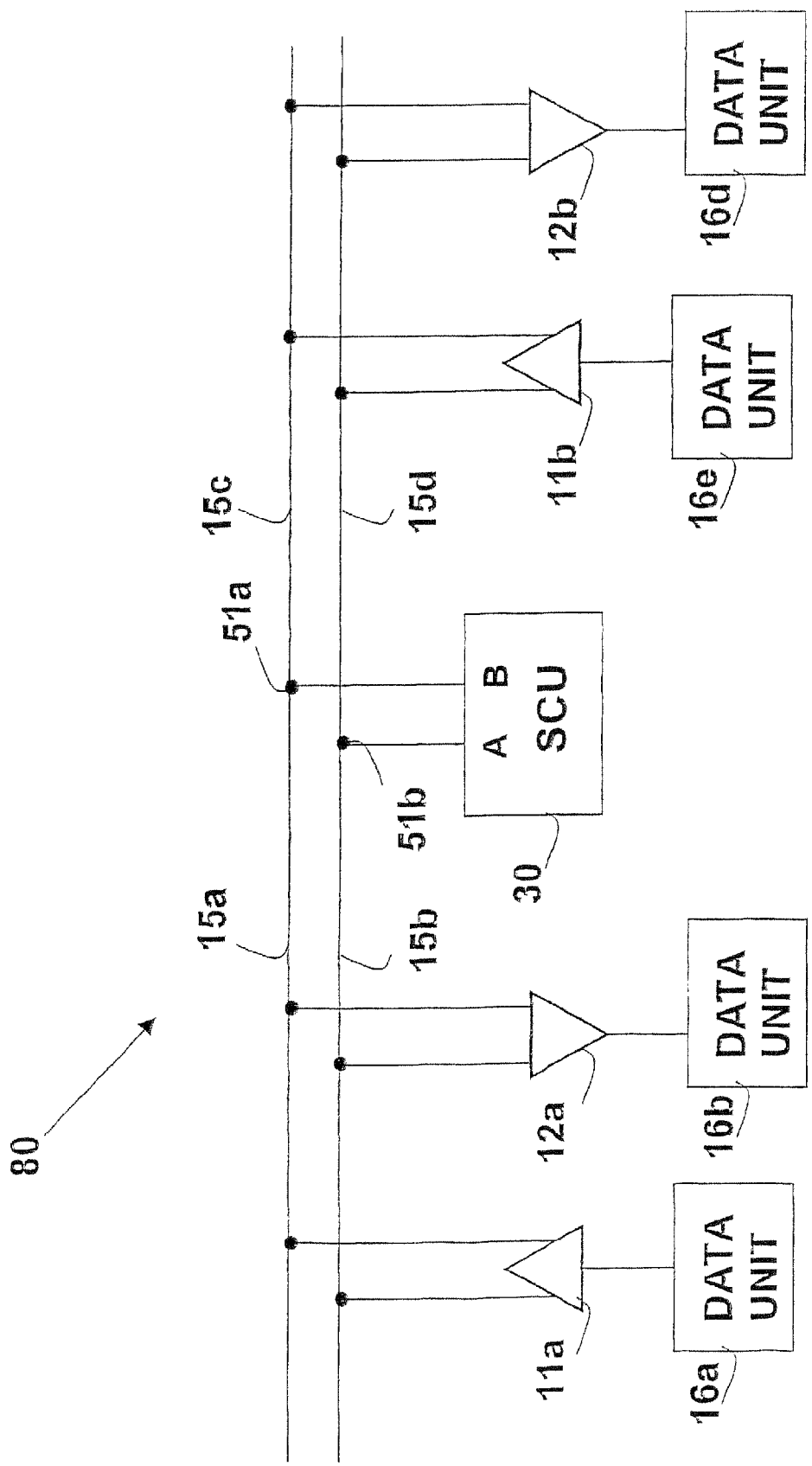
FIG. 8 shows a shared wiring based network, wherein an SCU is used for allowing multiple independent communication segments over continuous wiring according to the present invention.

The capability of an SCU to isolate electrically connected transmission line enables the formation of multiple distinct communication networks over continuous electrical conducting transmission line, as shown in FIG. 8. A network 80 is based on transmission line 15a, 15b, 15c, and 15d. SCU 30 connects to the transmission line at terminals 51a and 51b, and isolates the transmission line into two communication segments. One segment is based on transmission line 15a and 15b, and extends from terminals 51a and 51b towards the left in FIG. 8. The other segment is based on transmission line 15c and 15*d*, and extends toward the right. Data unit 16*a* transmits across transmission line 15*a* and 15*b* via line driver 11*a*, and provides the signal received by data unit 16*b* via line receiver 12*a*. Similarly, data unit 16*e* transmits across transmission line 15*c* and 15*d* via line driver 11*b*, with the signal received by data unit 16*d* via line receiver 12*b*. Being isolated by SCU 30, both transmissions can occur simultaneously, without interfering with each other. Additional line drivers, line receivers and transceivers can be added to each communication segment. Similarly, adding additional SCU's can split electrically-connected transmission line into more segments, wherein an isolated segment is formed between adjacent SCU pairs, or between the SCU and the ends or terminators of transmission lines.

Figure 9:
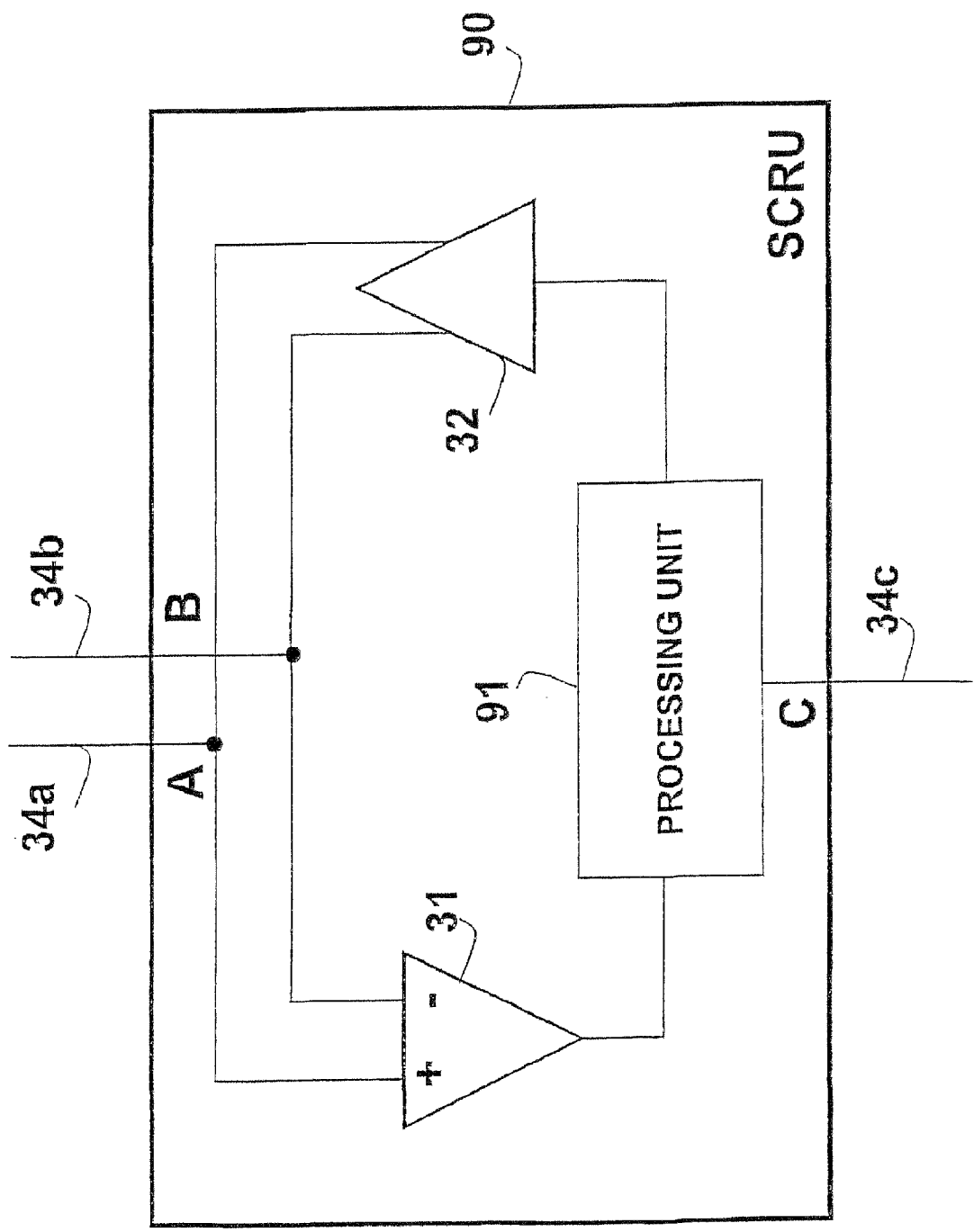
FIG. 9 shows a Signal Canceling and Receiving Unit (SCRU) functional block diagram according to a second embodiment of the present invention.

The function of the SCU has been so far been described only as a terminator, but an SCU can also be modified to perform a line receiving function, as shown in FIG. 9, which illustrates a Signal Canceling and Receiving Unit (SCRU) 90. SCRU 90 is based on the structure of SCU 30, (FIG. 3), but the processing unit 33 is modified to a processing unit 91, which provides additional output via a terminal 34*c* (C). The output on terminal 34*c* uses sensing function 31, and together with part of processing unit 91 serves as a line receiver, similar to line receiver 12*a* or 12*b*. Thus, SCRU 90 simultaneously performs two functions: signal cancellation as does SCU 30, and line receiver functionality, as do line receivers 12*a* and 12*b*, thus allowing the sensed signal or any function thereof to be output on the terminal 34*c* and placed on the transmission line.

Figure 10:
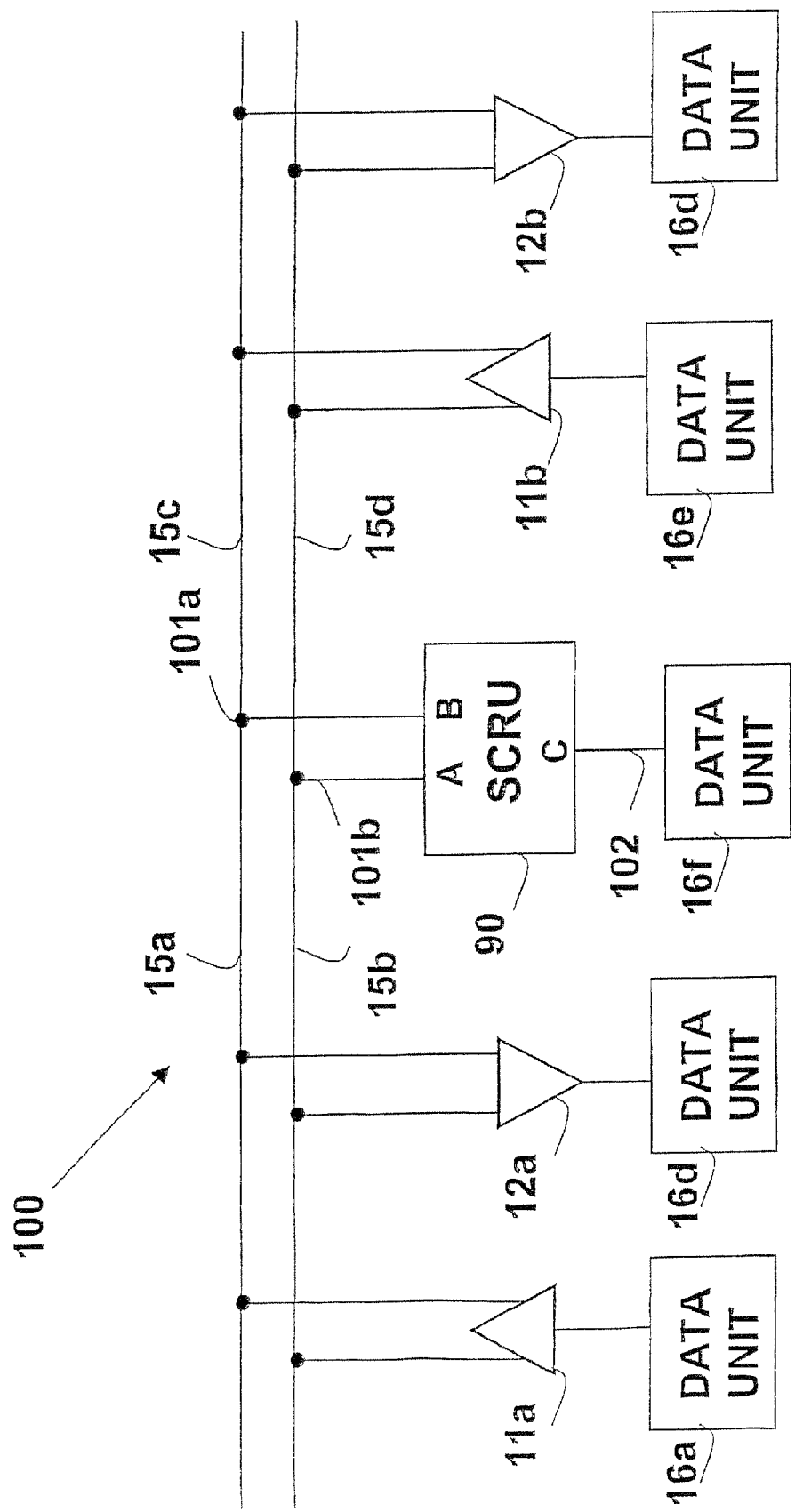
FIG. 10 shows a shared wiring based network, wherein an SCRU is used for allowing multiple independent communication segments over continuous wiring according to the present invention.

An example of an application using SCRU 90 is shown in FIG. 10, for a network 100. Network 100 is based on network 80 (FIG. 8), but SCU 30 is replaced by SCRU 90, whose terminal C is connected to a data unit 16*f* via a connection 102. SCRU 90 further is connected to transmission line 15*a*, 15*b*, 15*c*, and 15*d* at junctions 101*a* and 101*b*. In a manner similar to that of network 80 (FIG. 8), this configuration allows two isolated communication segments to use the transmission line simultaneously without interfering with each other. One segment transports data over transmission line 15*a* and 15*b*, while the other segment transports data over transmission line 15*c* and 15*d*. In addition, by utilizing the line-receiving functionality of SCRU 90, data unit 16*f* can receive signals from both networks.

Figure 11:
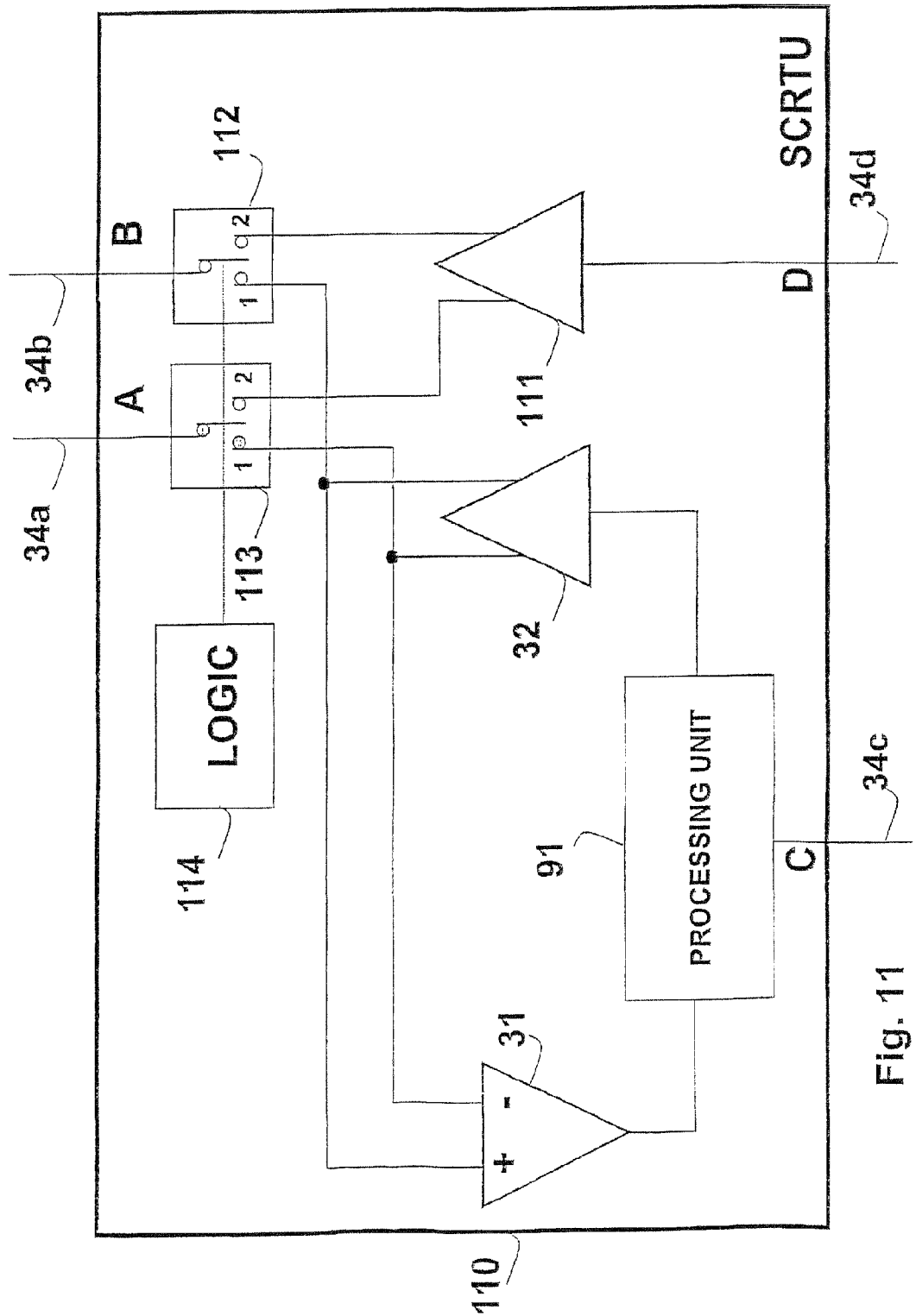
FIG. 11 shows a Signal Canceling, Receiving and Transmitting Unit (SCRTU) functional block diagram according to a third embodiment of the present invention.

In yet another embodiment of the invention, a line-driving capability is also integrated into the SCRU. FIG. 11 illustrates an SCRTU (Signal Canceling, Receive and Transmit unit) 110. SCRTU 110 includes all components of SCRU 90, but also includes a line driver 111 (constituting a "second driver"), which is fed from an additional SCRTU terminal 34*d* (D) and feeds a third signal to the transmission line. SCRTU 110 has two states of operation, denoted as "receive" and "transmit". In "receive" state, the functionality of SCRU 90 is fully retained, and SCRTU 110 performs signal cancellation and reception. In "transmit" state, line terminals 34*a* (A) and 34*b* (B) are connected to line driver 111 output terminals as shown, so that SCRTU 110 can transmit data received at terminal 34*d* to terminals 34*a* and 34*b*. Shifting between the states is performed by two SPDT (single pole double throw) switches 112 and 113. Switches 113 and 112 are connected to terminals 34*a* and 34*b*, respectively. In the 'receive' state, both switches 112 and 113 are in state '1', thus connecting terminal 34*a* and terminal 34*b* terminals to sensor 31 and driver 32, and thereby performing the function of SCRU 90. In the 'transmit' state, both switches 112 and 113 are in state '2', thus connecting terminal 34*a* and terminal 34*b* to the outputs of line driver 111, and thereby performing as a line driver. Switches 112 and 113 are controlled by a logic unit 114, which changes switches 113 and 112 as required to select the desired state.

Figure 12:
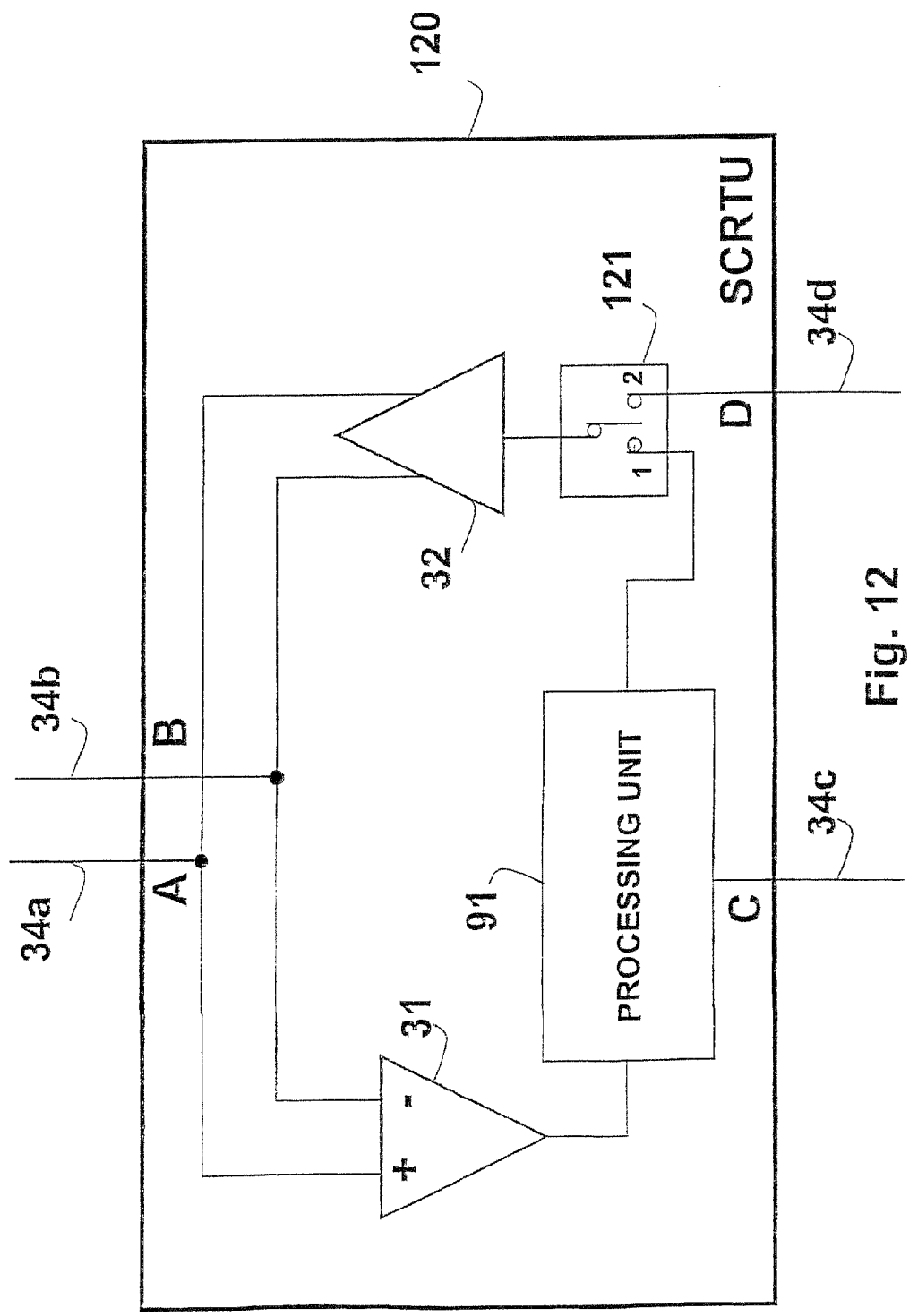
FIG. 12 shows an alternative Signal Canceling, Receiving and Transmitting Unit (SCRTU) functional block diagram according to a fourth embodiment of the present invention.

FIG. 12 illustrates an alternative implementation of an SCRTU 120. In this alternative configuration, driver 32 is also used as the line driver. An SPST switch 121 is used to route the input into driver 32. In state '1', driver 32 is connected to the output of processing 91, and thereby performing the function of SCRU 90. In state '2', driver 32 is coupled to terminal 34*d*, and thereby functions as a line driver. A logic block (not shown in FIG. 12) is used to control switch 121, shifting it from state to state as required.

Figure 13:
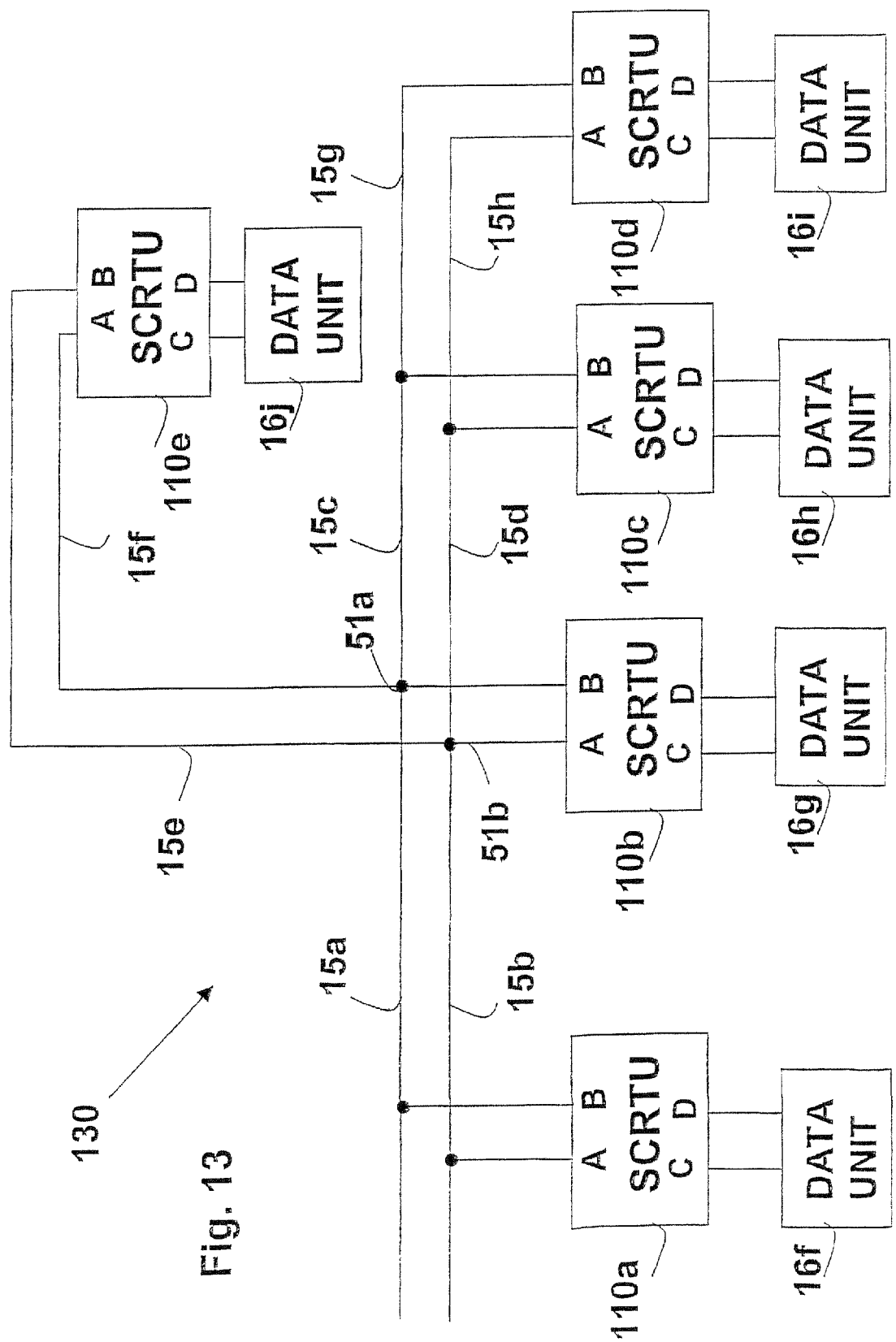
FIG. 13 shows a shared wiring based network, wherein multiple SCRTU's are used for allowing multiple independent communication segments over continuous wiring according to the present invention.

FIG. 13 illustrates a network 130 using such SCRTU's. Network 130 uses network transmission line 15*a*, 15*b*, 15*c*, 15*d*, 15*e*, 15*f*, 15*g*, and 15*h*, and has a bridge-tap at points 51*a* and 51*b*. Data units 16*f*, 16*g*, 16*h*, 16*i*, and 16*j* are coupled to the transmission line via SCRTU's 110*a*, 110*b*, 110*c*, 110*d*, and 110*e*, respectively. As explained above, although the wiring is electrically continuous, the communication segments formed are of point-to-point type between any SCRTU pair. SCRTU 110*a* communicates in a point-to-point topology with SCRTU 11*b*, over transmission line segment 15*a* and 15*b*. Similarly, SCRTU's 110*b* and 110*e* communicate over transmission line segment 15*e* and 15*f*, SCRTU's 110*b* and 110*c* communticate over transmission line segment 15*c* and 15*d*, and SCRTU's 110*c* and 110*d* communicate over transmission line segment 15*g* and 15*h*. In addition to the benefit of point-to-point, the network also allows for multiple independent communication segments to operate independently, as long as there are not any two SCRTU's transmitting to the same segment. For example, SCRTU 110*a* can transmit to SCRTU 110*b* over transmission line segment 15*a* and 15*b*, while SCRTU 110*d* can simultaneously transmit to SCRTU 110*c* over transmission line segment 15*g* and 15*h*.

Network 130 demonstrates the SCRTU based network capability of point-to-point communications and multiple transmissions over continuous wiring. These capabilities can be useful for existing wiring having unknown topology, and having 'bus' type connection points. For example, in-wall existing telephone wiring, in-wall existing power lines or CATV cabling which are not used for their original purpose. Continuity is common to all of these types of wiring, where outlets are provided for connecting to the wiring. Hence, coupling SCRTU's to each outlet allows for reliable high bandwidth communication between data units connected to the SCRTU'S.

While the invention has been described with respect to a digital communication application, it will be appreciated that the invention is equally applicable to analog communication as well, such as video, audio or any other type of communication. In such configurations, data units 16 are replaced by suitable analog units, and the SCU'S, SCRU's, and SCRTU's are modified accordingly to support such communication.

While the invention has been described with respect to a limited number of embodiments, it will be appreciated that many variations, modifications and other applications of the invention may be made.

What is claimed is:

1. A device for use with an existing CATV coaxial cable in walls of a building and connected to a CATV outlet having a coaxial connector, the CATV coaxial cable being connected in a bus topology for carrying a digital data signal, said device comprising:

a connector for connecting to the CATV outlet for coupling to the digital data signal carried over the CATV coaxial cable; and a termination circuit selectively couplable to said connector and constructed for terminating the digital data signal propagated over the CATV coaxial cable when said device is connected to said connector, wherein said device is switchable between a first state in which said termination circuit is coupled to said connector and a second state in which said termination circuit is not coupled to said connector.

2. The device according to claim 1, further comprising a sensor having a sensor input coupled to said connector, and a sensor output, said sensor being operative for sensing the digital data signal at said connector and for supplying to said sensor output a signal that is a function of the data signal that is sensed.

3. The device according to claim 2, wherein said termination circuit further comprises:

a driver having a driver input and a driver output, said driver output being couplable to said connector for placing a signal on the CATV coaxial cable; and a processing unit coupled between said sensor output and said driver input, and operative to supply said driver input with a signal that is effective to at least attenuate the digital data signal on the CATV coaxial cable at said connector.

4. The device according to claim 3, further comprising a receiver port coupled to said processing unit, and wherein said processing unit is operative in said first state to generate a signal that is a representation of the attenuated data signal and to supply the generated signal to said receiver port.

5. The device according to claim 3, further comprising a data unit port coupled to said processing unit and operative for coupling a data unit coupled to the data unit port to the CATV coaxial cable.

6. A communication system switchable between first and second states for use with a CATV coaxial cable in walls of a building in a bus topology and connected for carrying digital data signal, said system comprising:

a CATV outlet comprising a coaxial connector;

first and second CATV coaxial cable segments forming portions of the coaxial cable and connected to each other at said coaxial connector of said CATV outlet to form a continuous transmission line; and a termination device selectively couplable to said coaxial connector and, when coupled to said coaxial connector, operative to at least attenuate the digital data signal propagated between said first and second CATV coaxial cable segments, wherein in the first state said termination device is coupled to the coaxial connector, and in the second state said termination device is decoupled from the coaxial connector.

7. The communication system according to claim 6, further comprising a sensor having sensor inputs coupled to said coaxial connector, and a sensor output, said sensor being operative for sensing a signal at said coaxial connector and for supplying to said sensor output a signal that is a representation of the signal that is sensed.

8. The communication system according to claim 7, wherein said termination device comprises:

a driver selectively couplable to said coaxial connector and, when coupled to said coaxial connector, operative to conduct a signal over said first and second CATV coaxial cable segments.

9. The communication system according to claim 6, wherein said termination device comprises a data unit port coupled to said coaxial connector and couplable to a data unit, said data unit port being operative to couple the data unit to said first and second CATV coaxial cable segments.

10. The communication system according to claim 6, further comprising at least a third CATV coaxial cable segment connected to said coaxial connector.

11. The communication system according to claim 10, wherein at least one of said CATV coaxial cable segments is open-ended at an end remote from said coaxial connector.

* * * * *